United States Patent
Kang et al.

(10) Patent No.: US 9,783,698 B2
(45) Date of Patent: Oct. 10, 2017

(54) HARD COATING FILM

(71) Applicant: LG CHEM, LTD., Seoul (KR)

(72) Inventors: Joon-Koo Kang, Daejeon (KR);
Yeong-Rae Chang, Daejeon (KR);
Sung-Don Hong, Daejeon (KR);
Soon-Hwa Jung, Daejeon (KR);
Eun-Kyu Her, Daejeon (KR)

(73) Assignee: LG CHEM, LTD., Seoul (KR)

( * ) Notice: Subject to any disclaimer, the term of this patent is extended or adjusted under 35 U.S.C. 154(b) by 236 days.

(21) Appl. No.: 14/423,346

(22) PCT Filed: Jul. 29, 2013

(86) PCT No.: PCT/KR2013/006780
§ 371 (c)(1),
(2) Date: Feb. 23, 2015

(87) PCT Pub. No.: WO2014/030850
PCT Pub. Date: Feb. 27, 2014

(65) Prior Publication Data
US 2015/0252210 A1 Sep. 10, 2015

(30) Foreign Application Priority Data

Aug. 23, 2012 (KR) .................... 10-2012-0092533
Jul. 26, 2013 (KR) .................... 10-2013-0089107

(51) Int. Cl.
C09D 133/14 (2006.01)
C09D 105/16 (2006.01)
H05K 5/03 (2006.01)
C08L 51/08 (2006.01)
H04B 1/3888 (2015.01)
C08J 7/04 (2006.01)
C08K 3/36 (2006.01)

(52) U.S. Cl.
CPC ............ C09D 133/14 (2013.01); C08J 7/042 (2013.01); C08J 7/047 (2013.01); C08L 51/08 (2013.01); C09D 105/16 (2013.01); H04B 1/3888 (2013.01); H05K 5/03 (2013.01); C08J 2367/02 (2013.01); C08J 2433/06 (2013.01); C08K 3/36 (2013.01); C08K 2201/011 (2013.01); Y10T 428/24983 (2015.01)

(58) Field of Classification Search
CPC .................... C09D 133/14; C09D 105/16
See application file for complete search history.

(56) References Cited

U.S. PATENT DOCUMENTS

| | | | |
|---|---|---|---|
| 5,146,531 A | 9/1992 | Shustack | |
| 6,489,015 B1 | 12/2002 | Tsuchiya et al. | |
| 2004/0081831 A1 | 4/2004 | Shoshi et al. | |
| 2005/0136273 A1 | 6/2005 | Hashimoto et al. | |
| 2007/0134463 A1 | 6/2007 | Sinha et al. | |
| 2007/0178297 A1 | 8/2007 | Takada et al. | |
| 2007/0237966 A1 | 10/2007 | Takao et al. | |
| 2008/0145673 A1 | 6/2008 | Bonnard | |
| 2008/0193722 A1 | 8/2008 | Tanaka | |
| 2008/0311351 A1 | 12/2008 | Hsu et al. | |
| 2009/0169896 A1 | 7/2009 | Sohn et al. | |
| 2009/0202819 A1 | 8/2009 | Asahi et al. | |
| 2009/0214871 A1 | 8/2009 | Fukuda et al. | |
| 2010/0055377 A1 | 3/2010 | Esaki et al. | |
| 2010/0084037 A1 | 4/2010 | Ericsson et al. | |
| 2011/0050623 A1 | 3/2011 | Lee et al. | |
| 2011/0077334 A1 | 3/2011 | Oi et al. | |
| 2011/0124823 A1 | 5/2011 | Hayashi et al. | |
| 2012/0019766 A1 | 1/2012 | Oki et al. | |

FOREIGN PATENT DOCUMENTS

| | | |
|---|---|---|
| CN | 1286640 C | 11/2004 |
| CN | 102257087 A | 11/2011 |
| EP | 2397527 A1 | 12/2011 |
| EP | 2 840 107 A1 | 2/2015 |
| EP | 2 840 109 A1 | 2/2015 |
| EP | 2 840 110 A1 | 2/2015 |
| EP | 2 842 989 A1 | 3/2015 |
| EP | 2 843 008 A1 | 3/2015 |
| EP | 2857440 A1 | 4/2015 |
| JP | 2000015734 A | 1/2000 |
| JP | 2000-071392 A | 3/2000 |
| JP | 2000-214791 A | 8/2000 |
| JP | 2001-205179 A | 7/2001 |
| JP | 2001-323087 A | 11/2001 |
| JP | 2002-067238 A | 3/2002 |
| JP | 2002-338720 A | 11/2002 |
| JP | 2005-053094 A | 3/2005 |
| JP | 2005-288787 A | 10/2005 |
| JP | 2006-233167 A | 9/2006 |

(Continued)

OTHER PUBLICATIONS

"Ciba Tinuvin 900 Light Stabilizer". Ciba Specialty Chemicals, (1997); pp. 1-3.*
Machine Translation of JP2008-074112. Retrieved Dec. 19, 2016.*
Machine Translation of JP2011-046917. Retrieved Apr. 1, 2014.*
Machine translation of JP 2011246548. Retrieved Jun. 13, 2017.*
Communication from European Patent Office in corresponding application EP 13797819.3 mailed Dec. 17, 2015, 12 pages.
Extended Search Report dated Jan. 29, 2016 of EP Patent Application No. 13830624.6 (9 pages).
Extended Search Report dated Mar. 15, 2016 of EP Patent Application No. 13830681.6 (10 pages).
Extended Search Report dated Apr. 6, 2016 of EP Patent Application No. 13831101.4 (8 pages).
Extended Search Report dated Apr. 6, 2016 of EP Patent Application No. 138313275 (8 pages).
Extended Search Report dated Mar. 11, 2016 of EP Patent Application No. 138302724 (7 pages).

(Continued)

Primary Examiner — Prashant J Khatri
(74) Attorney, Agent, or Firm — Rothwell, Figg, Ernst & Manbeck, P.C.

(57) ABSTRACT

Disclosed is a hard coating film with high physical properties including hardness, scratch resistance, impact resistance, transparency, durability, light resistance, and light transmittance. The hard coating film can find useful applications in various fields thanks to its excellent physical properties.

21 Claims, No Drawings

(56) References Cited

FOREIGN PATENT DOCUMENTS

| | | |
|---|---|---|
| JP | 2008-075092 A | 4/2008 |
| JP | 4069499 B2 | 4/2008 |
| JP | 4075147 B2 | 4/2008 |
| JP | 4872893 B2 | 4/2008 |
| JP | 2008074112 A * | 4/2008 |
| JP | 2008116596 A | 5/2008 |
| JP | 2008-138165 A | 6/2008 |
| JP | 2008129130 A | 6/2008 |
| JP | 2008-150484 A | 7/2008 |
| JP | 2008197662 A | 8/2008 |
| JP | 2008-310286 A | 12/2008 |
| JP | 2009-204725 A | 9/2009 |
| JP | 2009204727 A | 9/2009 |
| JP | 2009-241458 A | 10/2009 |
| JP | 2010-017991 A | 1/2010 |
| JP | 2010-052334 A | 3/2010 |
| JP | 2010-053231 A | 3/2010 |
| JP | 2010121013 A | 6/2010 |
| JP | 2010-173234 A | 8/2010 |
| JP | 2010-284910 A | 12/2010 |
| JP | 2011-031457 A | 2/2011 |
| JP | 2011-031527 A | 2/2011 |
| JP | 2011022456 A | 2/2011 |
| JP | 2011504828 A | 2/2011 |
| JP | 2011046917 A * | 3/2011 |
| JP | 2011-075705 A | 4/2011 |
| JP | 2011-178910 A | 9/2011 |
| JP | 2011-201087 A | 10/2011 |
| JP | 2011-246548 A | 12/2011 |
| JP | 2012-081742 A | 4/2012 |
| JP | 4911474 B2 | 4/2012 |
| JP | 2012066477 A | 4/2012 |
| JP | 2013-095108 A | 5/2013 |
| KR | 10-1999-0072670 A | 9/1999 |
| KR | 10-2000-0021805 A | 4/2000 |
| KR | 10-2000-0021806 A | 4/2000 |
| KR | 10-2004-0037081 A | 4/2004 |
| KR | 10-2004-0097189 A | 11/2004 |
| KR | 10-2006-0009194 A | 1/2006 |
| KR | 1020060072072 A | 6/2006 |
| KR | 100730414 B1 | 6/2007 |
| KR | 10-2008-0005839 A | 1/2008 |
| KR | 10-2008-0055698 A | 6/2008 |
| KR | 10-0852562 B1 | 8/2008 |
| KR | 100852561 B1 | 8/2008 |
| KR | 10-2008-0109658 A | 12/2008 |
| KR | 1020090006131 A | 1/2009 |
| KR | 10-0884079 B1 | 2/2009 |
| KR | 10-2009-0044089 A | 5/2009 |
| KR | 1020090045105 A | 5/2009 |
| KR | 1020090047529 A | 5/2009 |
| KR | 10-2009-0063182 A | 6/2009 |
| KR | 1020090061821 A | 6/2009 |
| KR | 10-2009-0073668 A | 7/2009 |
| KR | 10-0905683 B1 | 7/2009 |
| KR | 10-0926220 B1 | 11/2009 |
| KR | 10-2010-0026014 A | 3/2010 |
| KR | 10-2010-0041992 A | 4/2010 |
| KR | 10-2010-0055160 A | 5/2010 |
| KR | 1020100045997 A | 5/2010 |
| KR | 10-2010-0129512 A | 12/2010 |
| KR | 10-2010-0132786 A | 12/2010 |
| KR | 10-2011-0034324 A | 4/2011 |
| KR | 10-2011-0037622 A | 4/2011 |
| KR | 101028463 B1 | 4/2011 |
| KR | 10-2011-0058743 A | 6/2011 |
| KR | 10-2011-0071480 A | 6/2011 |
| KR | 10-2011-0103885 A | 9/2011 |
| KR | 1020110119704 A | 11/2011 |
| KR | 10-2011-0130142 A | 12/2011 |
| KR | 10-2012-0002366 A | 1/2012 |
| KR | 10-1127952 B1 | 3/2012 |
| KR | 101114932 B1 | 3/2012 |
| KR | 10-2012-0058635 A | 6/2012 |
| KR | 10-1150719 B1 | 6/2012 |
| KR | 10-1168073 B1 | 7/2012 |
| KR | 10-2012-0136597 A | 12/2012 |
| KR | 101295325 B1 | 8/2013 |
| TW | 200907401 A | 2/2009 |
| TW | 201041985 A | 12/2010 |
| TW | 201130880 A | 9/2011 |
| TW | 201202403 A | 1/2012 |
| TW | I357922 B | 2/2012 |
| WO | 2006046855 A1 | 5/2006 |
| WO | WO 2008-098872 A1 | 8/2008 |
| WO | 2011/105532 A1 | 9/2011 |
| WO | 2012/026475 A1 | 3/2012 |
| WO | 2012/060145 A1 | 5/2012 |

OTHER PUBLICATIONS

Written Opinion and Search Report issued in related international application No. PCT/KR2013/006778 on Oct. 17, 2013 along with English translation, 17 pages.

Written Opinion and Search Report issued in related international application No. PCT/KR2013/006773 on Oct. 22, 2013 along with English translation, 20 pages.

Written Opinion and Search Report issued in related international application No. PCT/KR2013/006775 on Oct. 25, 2013 along with English translation, 25 pages.

Written Opinion and Search Report issued in related international application No. PCT/KR2013/006780 on Nov. 27, 2013 along with English translation, 20 pages.

Written Opinion and Search Report issued in related international application No. PCT/KR2013/006781 on Nov. 27, 2013 along with English translation, 18 pages.

Written Opinion and Search Report issued in related international application No. PCT/KR2013/006782 on Nov. 27, 2013 along with English translation, 20 pages.

Shin-Nakamura Chemical Industry Co., Ltd., [Sep. 20, 2016]—Product List, Photo curable monomers/oligomers: Urethane acrylates with English translation (2 pages).

Third Party Observation dated Oct. 14, 2016 of the corresponding Japanese Patent Application No. 2015-528383 (9 pages).

* cited by examiner

HARD COATING FILM

CROSS REFERENCE TO RELATED APPLICATIONS

This application is a 35 U.S.C. §371 National Phase Entry Application from PCT/KR2013/006780, filed on Jul. 29, 2013, and designating the United States, which claims priority under 35 U.S.C. §119 to Korean Patent Application No. 10-2012-0092533 filed on Aug. 23, 2012, and to Korean Patent Application No. 10-2013-0089107 filed on Jul. 26, 2013, which are incorporated herein by reference in their entireties.

BACKGROUND OF THE INVENTION

1. Field of the Invention

The present invention relates to a hard coating film. More particularly, the present invention relates to a hard coating film with high hardness and excellent properties.

This application claims the benefit of Korean Patent Application No. 10-2012-0092533, filed on Aug. 23, 2012, and Korean Patent Application No. 10-2013-0089107, filed on Jul. 26, 2013, which are all hereby incorporated by reference in their entireties into this application.

2. Description of the Related Art

With the advance of mobile appliances such as smart phones, tablet PCs and the like, substrates for displays have recently been required to become lighter and slimmer. Display windows or front panels of such mobile appliances are generally made of glass or reinforced glass both of which have excellent mechanical properties. However, glass suffers from the disadvantage of being heavy and being easily broken by an external impact.

As an alternative to glass, plastic resin films have emerged. Their light weight and resistance to impact are consistent with the trend of pursuing lighter and slimmer mobile appliances. Particularly, a film with high hardness and wear resistance is required. In this regard, it is proposed to utilize a structure in which the substrate is coated with a hard coating layer.

First of all, increasing the thickness of the hard coating layer is considered as an approach to improving the surface hardness thereof. In fact, the hard coating layer should be of a minimal thickness to ensure the surface hardness of the hard coating layer. As the hard coating layer increases in thickness, the surface hardness thereof may become higher. However, a thicker hard coating layer, although increasing the surface hardness, is more prone to setting shrinkage which leads to wrinkling or curling with the concomitant production of cracks or exfoliations, and thus thick hard coating layers are difficult to employ in practice.

Recently, some methods have been proposed for conferring a high hardness on hard coating films, without the problems of cracking and setting shrinkage-induced curling. Korean Patent Application Publication No. 2010-0041992 discloses a hard coating film composition, free of monomers, comprising a binder resin based on ultraviolet-curable polyurethane acrylate oligomers. However, this hard coating film has a pencil hardness of about 3H, and thus the strength thereof is not sufficient to be a substitute for glass panels for displays.

SUMMARY OF THE INVENTION

Accordingly, the present invention has been made keeping in mind the above problems occurring in the prior art, and is to provide a hard coating film which exhibits excellent properties including high hardness, and high impact resistance.

In accordance with an aspect thereof, the present invention provides a hard coating film, comprising:
a supporting substrate;
a first hard coating layer, formed on one side of the supporting substrate, having a first elastic modulus of 2,000 to 3,500 MPa; and
a second hard coating layer, formed on another side of the supporting substrate, having a second elastic modulus of 2,000 to 3,500 MPa, with a difference between the first and the second elastic moduli set to be less than 500 MPa.

Characterized by high hardness, impact resistance, scratch resistance, and transparency, as well as maintaining excellent enough processability to prevent curling or cracking therein, the hard coating film of the present invention can be usefully applied to mobile appliances, display instruments, and front panels and display windows of various instruments.

DESCRIPTION OF THE PREFERRED EMBODIMENTS

The present invention pertains to a hard coating film comprising: a supporting substrate; a first hard coating layer, formed on one side of the supporting substrate, having a first elastic modulus of 2,000 to 3,500 MPa; and a second hard coating layer, formed on another side of the supporting substrate, having a second elastic modulus of 2,000 to 3,500 MPa, with a difference between the first and the second elastic moduli set to be less than 500 MPa.

As used herein, the words "first" and "second" are employed only to describe various elements, and intended to discriminate one element from another.

All of the terms used in the specification are taken only to illustrate embodiments, and are not intended to limit the present invention. As used herein and in the appended claims, the singular forms "an", and "the" include plural reference unless the context clearly dictates otherwise. Unless the context clearly requires otherwise, throughout the description and the claims, the words "comprise," "comprising," and the like are to be construed in an inclusive sense as opposed to an exclusive or exhaustive sense, that is to say, in the sense of "including, but not limited to."

The above detailed descriptions of embodiments of the invention are not intended to be exhaustive or to limit the invention to the precise form disclosed above. While specific embodiments of, and examples for the invention are described above for illustrative purposes, various equivalent modifications are possible within the scope of the invention, as those skilled in the relevant art will recognize.

These and other non-limiting characteristics of the disclosure are more particularly disclosed below.

In accordance with an aspect thereof, the present invention addresses a hard coating film comprising: a supporting substrate; a first hard coating layer, formed on one side of the supporting substrate, having a first elastic modulus of 2,000 to 3,500 MPa; and a second hard coating layer, formed on another side of the supporting substrate, having a second elastic modulus of 2,000 to 3,500 MPa, with a difference between the first and the second elastic moduli set to be less than 500 MPa.

So long as it is transparent, any plastic resin, whether capable of being stretched or not, may be used for the substrate on each side of which a hard coating layer is formed, without limitations imposed thereto. According to an embodiment of the present invention, the substrate may include, for example, a polyester such as polyethyleneterephtalate (PET), a polyethylene such as ethylene vinyl acetate (EVA), cyclic olefin polymer (COP), cyclic olefin copolymer (COC), polyacrylate (PAC), polycarbonate (PC), polyethylene (PE), polymethylmethacrylate (PMMA), polyetheretherketon (PEEK), polyethylenenaphthalate (PEN), polyetherimide (PEI), polyimide (PI), triacetylcellulose (TAC), MMA (methyl methacrylate), or a fluoro-polymer. The substrate may be a single layer structure, and, if necessary, may be a multilayer structure including two or more layers composed of the same or different materials, but is not particularly limited.

According to an embodiment of the present invention, the substrate may be a multilayered substrate made of polyethyleneterephthalate (PET) or co-extruded polymethylmethacrylate (PMMA)/polycarbonate (PC).

Further, according to an embodiment of the present invention, the substrate may include a copolymer of polymethylmethacrylate (PMMA) and polycarbonate (PC).

The substrate may range in thickness from about 30 to about 1,200 μm, or from about 50 to about 800 μm, but is not limited thereto.

As described above, the hard coating film of the present invention comprises a supporting substrate with first and second hard coating layers formed on opposite sides of the substrate, respectively.

In the hard coating film of the present invention, the first hard coating layer has a first elastic modulus of 2,000 to 3,500 MPa while a second elastic modulus of 2,000 to 3,500 MPa is given to the second hard coating layer, with a difference between the first and the second elastic moduli set to be less than 500 MPa.

Throughout the specification, "elastic modulus" means a value measured according to ASTM D882.

That is, the hard coating film of the present invention comprises a substrate sandwiched between two hard coating layers, each having an elastic modulus of 2,000 MPa or higher wherein a difference in the elastic modulus therebetween is less than 500 MPa. The hard coating film in the hard coating layer structure exhibits high physical strength sufficient to be a substitute for glass, and is much less prone to curling or cracking, thus guaranteeing high processability.

In one embodiment, the difference between the first and the second elastic moduli is less than approximately 500 MPa, for example, ranges from 0 to less than approximately 500 MPa, or from 0 to less than approximately 300 MPa, or from 0 to less than approximately 200 MPa.

In accordance with an embodiment of the present invention, the first and the second elastic moduli may range approximately 2,000 to 3,500 MPa, or from approximately 2,000 to 3,000 MPa, or from approximately 2,000 to 2,800 MPa, with the proviso that a difference therebetween meets the conditions set forth above.

When a difference between the first and the second elastic moduli is within the range set forth above, the hard coating film has a high physical strength which is enough to be a substitute for glass, and does not suffer from problems with curling and cracking, thus exhibiting superior hardness and impact resistance.

Given the conditions for the first and the second elastic moduli, the first and the second hard coating layers may independently include a photocurable crosslinking copolymer of photocuarble elastic polymer and a tri- to hexafunctional acrylate monomer, and organic microparticles dispersed in the photocurable crosslinking polymer.

In one embodiment, the first and the second hard coating layers of the present invention are respectively formed on opposite sides of the supporting substrate, and comprise a photocurable crosslinking copolymer of a photocurable elastic polymer and a tri- to hexafunctional acrylate monomer, and inorganic microparticles dispersed in the photocurable crosslinking copolymer.

According to an embodiment of the present invention, the thickness ratio of the substrate to the hard coating layer formed on one side of the substrate may be about 1:0.5 to about 1:2, or about 1:0.5 to about 1:1.5. When the thickness ratio thereof is within the above range, a hard coating film can be formed which exhibits high hardness without being prone to curling or cracking.

As used herein, the term "acrylate" is intended to encompass acrylate, methancrylate, and derivatives thereof with various substituents.

As used herein, the term "photocurable elastic polymer" refers to a polymer which is elastic and contains a functional group that undergoes UV light-triggered crosslink polymerization.

According to an embodiment of the present invention, the photocurable elastic polymer may have an elongation of approximately 15% or more, for example, approximately 15 to 200%, approximately 20 to 200%, or approximately 20 to 150%, as measured according to ASTM D638.

The photocurable elastic polymer is crosslink-polymerized with the tri- to hexafunctional acrylate monomer and then cured to form a hard coating layer, conferring flexibility and impact resistance to the hard coating film.

Based on 100 weight parts thereof, the photocurable crosslinking copolymer may contain the photocurable elastic polymer in an amount of 5 to 20 weight parts and the tri- to hexafunctional acrylate monomer in an amount of 80 to 95 weight parts.

When the tri- to hexafunctional acrylate monomer and the photocurable elastic polymer are crosslink polymerized with each other at a weight ratio, the hard coating layer is imparted with excellent physical properties including sufficient impact resistance.

According to one embodiment of the present invention, the photocurable elastic polymer may be a polymer or oligomer having a weight average molecular weight of about 1,000 to about 600,000 g/mol or about 10,000 to about 600,000 g/mol.

The photocurable elastic polymer may be at least one selected from the group consisting of polycaprolactone, a urethane acrylate polymer, and polyrotaxane.

Among the polymers used as the photocurable elastic polymer, polycaprolactone is formed by the ring-opening polymerization of caprolactone, and has excellent physical properties such as flexibility, impact resistance, durability and the like.

Retaining a urethane bond therein, a urethane acrylate polymer has excellent elasticity and durability.

A polyrotaxane is a polymer of rotaxane, a mechanically-interlocked molecular architecture consisting of a dumbbell-shaped molecule which is threaded through a cyclic moiety (macrocycle). The two components of a rotaxane are kinetically trapped since the ends of the dumbbell (stoppers) are larger than the internal diameter of the ring and prevent disassociation of the components since this would require significant distortion of the covalent bonds.

In one embodiment, the photocurable elastic polymer may include a rotaxane comprising a cyclic moiety (macrocycle) in which lactone compounds with a (meth)acrylate moiety conjugated to the end thereof and are bonded each other; a thread moiety held within the macrocycle; and stoppers provided at both ends of the thread moiety so as to prevent dissociation of the macrocycle.

No particular limitations are imposed on the macrocycle if it is large enough to surround the linear moiety. The macrocycle may include a functional group such as a hydroxide group, an amino group, a carboxyl group, a thiol group, an aldehyde group or the like, which can react with other polymers or compounds. Specific examples of the macrocycle may include α-cyclodextrin, ρ-cyclodextrin, γ-cyclodextrin and mixtures thereof.

Further, the thread may be used without limitation as long as it is generally linear in shape with a minimal predetermined weight or greater. Preferably, a polyalkylene compound or a polylactone compound may be used in the thread. Specifically, a polyoxyalkylene compound including an oxyalkylene repetitive unit of 1 to 8 carbon atoms or a polylactone compound including a lactone repetitive unit of 3 to 10 carbon atoms may be used in the thread.

Meanwhile, the stopper may be appropriately adjusted depending on the characteristics of the rotaxane compound to be prepared. For example, the stopper may be at least one selected from the group consisting of a dinitrophenyl group, a cyclodextrin group, an amantane group, a trilyl group, a fluorescein group and a pyrene group.

Exhibiting excellent scratch resistance, polyrotaxane can recover itself when it is damaged or scratched.

As the first and the second hard coating layers, each containing a photocurable elastic polymer, are formed by photocuring, they allows the hard coating film to have high hardness and flexibility, ensuring excellent resistance to external impact.

Examples of the tri- to hexa-functional acrylate monomers may include trimethylolpropane triacrylate (TMPTA), trimethylolpropaneethoxy triacrylate (TMPEOTA), glycerin-propoxylated triacrylate (GPTA), pentaerythritol tetraacrylate (PETA), dipentaerythritol hexaacrylate (DPHA), and the like. These tri- to hexa-functional acrylate monomers may be used alone or in combination.

The first and the second hard coating layers comprise inorganic microparticles dispersed in the photocurable crosslinking copolymer.

According to an embodiment of the present invention, the inorganic particles may be inorganic nanoparticles having a particle size of about 100 nm or less, about 10 to about 100 nm or about 10 to about 50 nm. For example, silica particles, aluminum oxide particles, titanium oxide particles or zinc oxide particles may be used as the inorganic particles.

The inorganic particles in the hard coating layer make an additional contribution to improving the hardness of the hard coating film.

Based on 100 weight parts thereof, the first or the second hard coating layer may contain the photocurable crosslinking copolymer in an amount of approximately 40 to 90 weight parts and the inorganic microparticles in an amount of to 60 weight parts, or the photocurable crosslinking copolymer in an amount of approximately 50 to 80 weight parts and the inorganic microparticles in an amount of approximately 20 to 50 weight parts. Given the amounts of the photocurable copolymer and the inorganic microparticles within the ranges set forth above, the hard coating film can be formed with excellent physical properties.

Meanwhile, the first and the second hard coating layers may further include typical additives such as a surfactant, a yellowing inhibitor, a leveling agent, an antifouling agent and the like in addition to the above-mentioned components. Here, the content of the additive is may be variously adjusted to the degree that the physical properties of the hard coating film are not degraded. Its content is not particularly limited, but preferably ranges from approximately 0.1 to 10 weight parts, based on 100 weight parts of the photocurable crosslinking copolymer.

According to an embodiment of the present invention, for example, the first and the second hard coating layers may include a surfactant as an additive. The surfactant may be a mono- or bi-functional fluorine acrylate, a fluorine surfactant, or a silicon surfactant. In this context, the surfactant may be contained in a dispersed or crosslinked form in the photocurable crosslinking copolymer.

Further, the first and the second hard coating layers may include a yellowing inhibitor as an additive. The yellowing inhibitor may be a benzophenone compound or a benzotriazole compound.

The first and the second hard coating layers may be independently formed by photocuring a hard coating composition comprising a tri- to hexa-functional acrylate monomer, a photocurable elastic polymer, inorganic microparticles, an organic solvent, and optionally an additive in the presence of a photoinitiator.

Examples of the photoinitiator may include, but are not limited to, 1-hydroxy-cyclohexyl-phenyl ketone, 2-hydroxy-2-methyl-1-phenyl-1-propanone, 2-hydroxy-1-[4-(2-hydroxyethoxy)phenyl]-2-methyl-1-propanone, methyl-benzoylformate, α,α-dimethoxy-α-phenylacetophenone, 2-benzoyl-2-(dimethylamino)-1-[4-(4-morpholinyl)phenyl]-1-butanone, 2-methyl-1-[4-(methylthio)phenyl]-2-(4-morpholinyl)-1-propanone, diphenyl(2,4,6-trimethylbenzoyl)-phosphine oxide, bis(2,4,6-trimethylbenzoyl)-phenylphophine oxide, and the like. Further, the photoinitiator may be commercially available, such as those sold under brand name, Irgacure 184, Irgacure 500, Irgacure 651, Irgacure 369, Irgacure 907, Darocur 1173, Darocur MBF, Irgacure 819, Darocur TPO, Irgacure 907, and Esacure KIP 100F. These photoinitiators may be used alone or in combination.

Examples of the organic solvent available in the present invention may include: alcohols such as methanol, ethanol, isopropyl alcohol, butanol and the like; alkoxy alcohols such as 2-methoxy ethanol, 2-ethoxy ethanol, 1-methoxy-2-propanol and the like; ketones such as acetone, methyl ethyl ketone, methyl isobutyl ketone, methyl propyl ketone, cyclohexanone and the like; ethers such as propyleneglycol monopropyl ether, propyleneglycol monomethyl ether, ethyleneglycolmonoethyl ether, ethyleneglycol monopropyl ether, ethyleneglycol monobutyl ether, diethyleneglycol monomethyl ether, diethyleneglycol monoethyl ether, diethyleneglycol monopropyl ether, diethyleneglycol monobutyl ether, diethyleneglycol-2-ethylhexyl ether and the like; and aromatic solvents such as benzene, toluene, xylene and the like. These organic solvents may be used alone or in combination.

In the respective compositions for the first and the second hard coating layers (hereinafter referred to as "first hard coating composition" and "second hard coating composition", respectively), the solid fraction including the tri- to hexa-functional acrylate monomer, the photocurable elastic polymer, the photoinitiator, and other additives may be used at a weight ratio of about 70:30 to about 99:1 with regard to the solvent. As such, when the hard coating composition has a high solid content, the hard coating composition increases in viscosity, and thus can allow for a thick coating, for example, form the first and the second hard coating layers at a thickness of 50 μm or more.

The first and the second hard coating compositions comprising the above-mentioned components are applied onto respective side of the substrate, followed by photocuring the hard coating composition to form the first and the second hard coating layers. Any method that is available in the art can be used without particular limitations. For example, the hard coating composition may be applied by bar coating, knife coating, roll coating, blade coating, die coating, microgravure coating, comma coating, slot die coating, lip coating, solution casting or the like.

After being completely cured, the first and the second hard coating layers have a thickness of approximately 50 μm or higher, for example, approximately 50 to 300 μm, approximately 50 to 200 μm, approximately 50 to 150 μm, or approximately 70 to 150 μm. According to the present invention, a hard coating film of high hardness can be prepared without the formation of curls or cracks even when the hard coating layers are formed to the above thickness.

In accordance with one embodiment, the hard coating film of the present invention may further comprise at least one layer, or film, such as a plastic resin film, an adhesive film, an releasable film, an electrically conductive film, an electrically conductive layer, a curable resin layer, a non-conductive film, a metal mesh layer, or patterned metal layer, on either or both of the first and the second hard coating layers. In addition, the layer, or film may take any form such as a monolayer, a bilayer or a lamination. The layer, or film may be constructed on the hard coating layer by, but not limited to, laminating a freestanding film with the aid of an adhesive or an adhesive film, or by coating, deposition, or sputtering.

The hard coating film according to the present invention may be prepared using the following method.

According to one embodiment of the present invention, the first hard coating composition is applied to one side of the substrate and photocured, after which the second hard coating composition is subsequently applied to the other side of the substrate and photocured. In this context, the first and the second hard coating compositions are the same as the hard coating composition and are just terminologically discriminated for application to one and the other side of the substrate.

In the subsequent photocuring step, UV light is irradiated to a side opposite to that coated with the first hard coating composition. Thus, the curl which may be generated by setting shrinkage in the former photocuring step is counterbalanced to afford a flat hard coating film. No additional flattening processes are thus needed.

When the hard coating film of the present invention is disposed on a plane after exposure to a temperature of 50° C. or higher at a humidity of 80% or higher for 70 hrs, the maximum distance at which each edge or side of the hard coating film is spaced apart from the plane may be about 1.0 mm or less, about 0.6 mm or less, or about 0.3 mm or less. More specifically, when the hard coating film of the present invention is exposed to a temperature of 50 to 90° C. and a humidity of 80 to 90% for 70 to 100 hours or more and then placed on a plane, the maximum distance at which each edge of the hard coating film is spaced apart from the plane may be about 1.0 mm or less, about 0.6 mm or less, or about 0.3 mm or less.

Exhibiting excellent physical properties including hardness, scratch resistance, impact resistance, transparency, durability, light resistance, and light transmittance, the hard coating film of the present invention has useful applications in various fields.

The impact resistance of the hard coating film is high enough to be a substitute for glass. For example, the hard coating film of the present invention may not crack even after a steel bead weighing 22 g is freely dropped ten times from a height of 50 cm thereto.

In addition, the hard coating film of the present invention may have a pencil hardness of 7H or more, 8H or more, or 9H or more at a load of 1 kg.

Further, when a friction tester is mounted with a steel wool #0000 and then the steel wool #0000 is reciprocated on the hard coating film of the present invention 400 times under a load of 500 g, two or less scratches may be formed on the hard coating film.

The hard coating film of the present invention may have a light transmittance of 91.0% or more, or 92.0% or more, and a haze of 1.0% or less, 0.5% or less, or 0.4% or less. Further, the hard coating film of the present invention may have an initial color b value of 1.0 or less. After the hard coating film is exposed to UV-B under an ultraviolet lamp for 72 hrs or more, it may have a color b* value which differs from the pre-exposed color b* value by 0.5 or less, or by 0.4 or less.

As described above, the hard coating film of the present invention can be applied to various fields. For example, the hard coating film of the present invention can be used in touch panels of mobile terminals, smart phones or tablet PCs, and cover or device panels of various displays.

A better understanding of the present invention may be obtained through the following examples which are set forth to illustrate, but are not to be construed as limiting the present invention.

EXAMPLES

Preparation Example 1: Preparation of Photocurable Elastic Polymer

In a reactor, 50 g of a caprolactone-grafted polyrotaxane polymer [A1000, Advanced Soft Material INC] was mixed with 4.53 g of Karenz-AOI [2-acryloylethyl isocyanate, Showadenko Inc.], 20 mg of dibutyltin dilaurate [DBTDL, Merck Corp.], 110 mg of hydroquinone monomethylene ether, and 315 g of methyl ethyl ketone. Then, the mixture was reacted at 70° C. for 5 hrs to obtain polyrotaxane in which polylactone with an acrylate moiety conjugated to the end thereof acted as the macrocycle while cyclodextrin was positioned as the stopper.

The polyrotaxane had a weight average molecular weight of 600,000 g/mol, and was found to have an elongation of 20%, as measured according to ASTM D638.

Example 1

A hard coating composition was prepared by mixing 9 g of a silica-dipentaerythritolhexacrylate (DPHA) composite in which silica nanoparticles with a particle size of 20-30 nm were dispersed by 40 wt % (silica 3.6 g, DPHA 5.4 g), 1 g of polyrotaxane of Preparation Example 1, 0.2 g of a photoinitiator (brand name: Darocur TPO), 0.1 g of a benzotriazole-based yellowing inhibitor (brand name: Tinuvin 400) and 0.05 g of a fluorine surfactant (brand name: FC4430).

The hard coating composition was applied onto both sides of a PET substrate having a size of 15 cm×20 cm and a thickness of 188 μm by bar coating. Then, the both sides of the substrate which were coated with the hard coating composition were passed between ultraviolet (UV) illuminators, each of which was mounted with a metal halide lamp emitting a wavelength of 290-320 nm to photocure the hard coating composition to form a hard coating layer on each side of the substrate.

The hard coating layer on each side of the substrate was 100 μm thick.

Example 2

A hard coating film was prepared in the same manner as in Example 1, with the exception that 1 g of a urethane acrylate polymer (brand name: UA200PA, Shinnakamura Chemicals Corp., weight average molecular weight: 2,600 g/mol, elongation measured according to ASTM D638: 170%) was used instead of 1 g of polyrotaxane of Preparation Example 1.

Example 3

A hard coating film was prepared in the same manner as in Example 1, with the exception that 1 g of a urethane acrylate polymer (brand name: UA340P, Shinnakamura Chemicals Corp., weight average molecular weight: 13,000 g/mol, elongation measured according to ASTM D638: 150%) was used instead of 1 g of polyrotaxane of Preparation Example 1.

Example 4

A hard coating film was prepared in the same manner as in Example 1, with the exception that the hard coating layer formed on each side of the substrate after completion of photocuring in Example 1 was 150 μm.

Comparative Example 1

With the exception that a hard coating composition was prepared by mixing 10 g of a silica-dipentaerythritol-hexacrylate (DPHA) composite in which silica nanoparticles with a particle size of 20-30 nm were dispersed by 40 wt % (silica 4 g, DPHA 6 g), 0.1 g of a benzotriazole-based yellowing inhibitor (brand name: Tinuvin 400) and 0.05 g of a fluorine surfactant (brand name: FC4430), a hard coating film was prepared in the same manner as in Example 1.

The elastic modulus of the first and the second hard coating layers in the hard coating films of Examples 1 to 4 and Comparative Example 1 are summarized in Table 1, below.

TABLE 1

| | Elastic Modulus of 1st Hard Coating Layer (unit: MPa) | Elastic Modulus of 2nd Hard Coating Layer (unit: MPa) | Difference of Elastic Modulus (unit: MPa) |
| --- | --- | --- | --- |
| Example 1 | 2500 | 2450 | 50 |
| Example 2 | 2300 | 2260 | 40 |
| Example 3 | 2350 | 2290 | 60 |
| Example 4 | 2500 | 2450 | 50 |
| C. Example 1 | 3650 | 3540 | 110 |

TEST EXAMPLES

<Measuring Method>
1) Pencil Hardness

A pencil hardness was evaluated according to the Japanese Standard JIS K5400. In this regard, a pencil hardness meter was reciprocated three times on each of the hard coating films under a load of 1.0 kg to determine the hardness at which no scratches appeared.

2) Scratch Resistance

After being loaded to a friction tester, a steel wool (#0000) was reciprocated 400 times on each of the hard coating films under a load of 0.5 kg. Evaluation was made of the scratch resistance of the films by marking 0 for two or less scratches, Δ for two to less than five scratches, and x for five or more scratches.)

3) Light Resistance

Differences in color b* value of the hard coating films were measured before and after exposure to UVB from UV lamp for 72 hrs.

4) Transmittance and Haze

The hard coating films were measured for transmittance and haze using a spectrophotometer (brand name: CHO-400))

5) Curl Property to Temperature and Humidity

After a hard coating film piece with dimensions of 10 cm×10 cm was stored for 72 hrs in a chamber maintained at a temperature of 85° C. and a humidity of 85%, it was placed on a flat plane. A maximal distance at which each edge of the piece was apart from the plane was measured.

6) Cylindrical Bending Test

Each of the hard coating films was wound on a cylindrical mandrel having a diameter of 3 cm. When the hard coating film was not cracked, it was evaluated as OK. If the hard coating film was cracked, it was evaluated as X.

7) Impact Resistance

The impact resistance of each of the hard coating films was evaluated by determining whether or not each of the hard coating films was cracked when a 22 g steel ball was freely dropped 10 times thereon from a height of 50 cm. Each of the hard coating films was evaluated as OK when it was not cracked, and as X when cracked.

The results of the physical properties measured in each of the hard coating films are summarized in Table 2 below.

TABLE 2

| | Ex. 1 | Ex. 2 | Ex. 3 | Ex. 4 | C. Ex. 1 |
| --- | --- | --- | --- | --- | --- |
| Pencil hardness | 9H | 9H | 8H | 9H | 9H |
| Scratch resistance | ○ | ○ | ○ | ○ | ○ |
| Light resistance | 0.20 | 0.25 | 0.21 | 0.24 | 0.35 |
| Transmittance | 92.0 | 92.3 | 91.8 | 92.0 | 92.0 |
| Haze | 0.3 | 0.2 | 0.3 | 0.4 | 0.4 |
| Bending test | OK | OK | OK | OK | X |
| Curl property at high humidity & temperature | 0.0 mm | 0.0 mm | 0.0 mm | 0.0 mm | 0.0 mm |
| Impact resistance | OK | OK | OK | OK | X |

As shown in Table 2 above, it can be ascertained that all of the hard coating films of the present invention exhibit good physical properties. In contrast, the film, prepared in Comparative Example 1, in which the first and the second hard coating layers had an elastic modulus higher than 3,500 MPa was found to be insufficient in impact resistance.

What is claimed is:
1. A hard coating film, comprising:
a supporting substrate;
a first hard coating layer, formed on one side of the supporting substrate, having a first elastic modulus of 2,000 to 3,500 MPa; and
a second hard coating layer, formed on another side of the supporting substrate, having a second elastic modulus of 2,000 to 3,500 MPa, with a difference between the first and the second elastic moduli is less than 500 MPa, and wherein the first and the second hard coating layers independently comprise a photocurable crosslinking copolymer of a photocurable elastic polymer and a tri- to hexa-functional acrylate monomer, and inorganic microparticles dispersed in the photocurable crosslinking copolymer, wherein the first and second hard coating layers independently have a thickness of 50 to 300 µm, and wherein the hard coating film exhibits a pencil hardness of 7H or more at a load of 1 kg.

2. The hard coating film of claim 1, wherein the difference between the first and the second elastic moduli is less than 300 MPa.

3. The hard coating film of claim 1, wherein the first and the second elastic moduli independently range from 2,000 to 3,000 MPa.

4. The hard coating film of claim 1, wherein the photocurable elastic polymer has an elongation of 15 to 200%, as measured according to ASTM D638.

5. The hard coating film of claim 1, wherein the photocurable elastic polymer is selected from the group consisting of polycaprolactone, a urethane acrylate polymer, a polyrotaxane, and a combination thereof.

6. The hard coating film of claim 5, wherein the polyrotaxane comprises a cyclic moiety (macrocycle) in which lactone compounds with a (meth)acrylate moiety conjugated to the end thereof are bonded each other; a thread moiety held within the macrocycle; and stoppers provided at both ends of the thread moiety so as to prevent dissociation of the macrocycle.

7. The hard coating film of claim 1, wherein the first and second hard coating layers independently contain the photocurable crosslinking copolymer in an amount of 40 to 90 weight parts and the inorganic particles in an amount of 10 to 60 weight parts, based on 100 weight parts of the hard coating layer.

8. The hard coating film of claim 1, wherein the first and second hard coating layers independently contain 5 to 20 weight parts of the photocurable elastic polymer polymerized with 80 to 95 weight parts of the tri- to hexa-functional acrylate monomer, based on 100 weight parts of the photocurable crosslinking copolymer.

9. The hard coating film of claim 1, wherein the inorganic microparticles have a particle size of 100 nm or less.

10. The hard coating film of claim 1, wherein the inorganic microparticles include selected from the group consisting of silica nanoparticles, aluminum oxide microparticles, titanium oxide microparticles, zinc oxide microparticles, and a combination thereof.

11. The hard coating film of claim 1, wherein the tri- to hexa-functional acrylate monomer includes selected from the group consisting of trimethylolpropane triacrylate (TMPTA), trimethylolpropane ethoxytriacrylate (TMPEOTA), glycerin propoxylated triacrylate (GPTA), pentaerythritol tetraacrylate (PETA), dipentaerythritol hexaacrylate (DPHA), and a combination thereof.

12. The hard coating film of claim 1, further comprising an additive dispersed or crosslinked in the photocurable crosslinking copolymer.

13. The hard coating film of claim 12, wherein the additive is dispersed or crosslinked in the photocurable crosslinking copolymer and is selected from the group consisting of a mono- to bi-functional fluorine acrylate, a fluorine surfactant, a silicon surfactant, and a combination thereof.

14. The hard coating film of claim 12, wherein the additive is dispersed in the photocurable crosslinking copolymer, and comprises a yellowing inhibitor including a benzophenone compound or a benzotriazole compound.

15. The hard coating film of claim 1, wherein the supporting substrate includes at least one selected from consisting of polyethyleneterephtalate (PET), ethylene vinyl acetate (EVA), a cyclic olefin polymer (COP), a cyclic olefin copolymer (COC), polyacrylate (PAC), polycarbonate (PC), polyethylene (PE), polymethylmethacrylate (PMMA), polyetheretherketon (PEEK), polyethylenenaphthalate (PEN), polyetherimide (PEI), polyimide (PI), triacetylcellulose (TAC), MMA (methyl methacrylate) and a fluoropolymer.

16. The hard coating film of claim 1, wherein the hard coating film does not crack when a 22 g steel ball is freely dropped 10 times thereon from a height of 50 cm.

17. The hard coating film of claim 1, wherein two or less scratches are formed when the surface of the hard coating film is rubbed by reciprocating a steel wool #0000 thereon 400 times under a load of 500 g.

18. The hard coating film of claim 1, having a visible light transmittance of 91% or more, a haze of 0.4 or less, and a color b* value of 1.0 or less.

19. The hard coating film of claim 1, wherein the hard coating film has a color b* value after exposure to UV B for 72 hrs which differs from a pre-exposed, color b* value by 0.5 or less.

20. The hard coating film of claim 1, further comprising on the first or the second hard coating layer at least one layer selected from the group consisting of a plastic resin film, an adhesive film, an releasable film, an electrically conductive film, an electrically conductive layer, a curable resin layer, a non-conductive film, a metal mesh layer, and a patterned metal layer.

21. The hard coating film of claim 1, wherein when the hard coating film is disposed on a plane after exposure to a temperature of 50° C. or higher at a humidity of 80% or higher for 70 hrs or longer, each edge or side of the hard coating film is spaced apart from the plane by 1.0 mm or less, maximally.

* * * * *